United States Patent
Nagamine et al.

(10) Patent No.: US 9,070,866 B2
(45) Date of Patent: Jun. 30, 2015

(54) MAGNETORESISTIVE EFFECT ELEMENT AND MANUFACTURING METHOD THEREOF

(71) Applicant: KABUSHIKI KAISHA TOSHIBA, Tokyo (JP)

(72) Inventors: Makoto Nagamine, Tokyo (JP); Daisuke Ikeno, Yokohama (JP); Katsuya Nishiyama, Yokohama (JP); Katsuaki Natori, Yokohama (JP); Koji Yamakawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/961,805

(22) Filed: Aug. 7, 2013

(65) Prior Publication Data

US 2014/0284732 A1 Sep. 25, 2014

Related U.S. Application Data

(60) Provisional application No. 61/804,503, filed on Mar. 22, 2013.

(51) Int. Cl.
*H01L 43/10* (2006.01)
*H01L 43/12* (2006.01)

(52) U.S. Cl.
CPC ............. *H01L 43/10* (2013.01); *H01L 43/12* (2013.01)

(58) Field of Classification Search
CPC ......... H01L 43/08; H01L 43/10; H01L 45/04; H01L 45/146; G01R 33/098; G01R 33/093; G11B 5/3906; G11B 5/3909
See application file for complete search history.

(56) References Cited

U.S. PATENT DOCUMENTS

| 7,910,914 | B2 | 3/2011 | Tanaka et al. | |
| 2006/0056114 | A1* | 3/2006 | Fukumoto et al. | 360/324.2 |
| 2008/0175032 | A1 | 7/2008 | Tanaka et al. | |
| 2009/0080238 | A1 | 3/2009 | Yoshikawa et al. | |
| 2009/0257151 | A1 | 10/2009 | Zhang et al. | |
| 2011/0084348 | A1 | 4/2011 | Kuribayashi et al. | |
| 2012/0061779 | A1 | 3/2012 | Ohmori et al. | |

(Continued)

FOREIGN PATENT DOCUMENTS

EP 2421063 A1 * 2/2012
JP 2010-097977 A 4/2010

(Continued)

OTHER PUBLICATIONS

Suzuki et al., Hybrid magnetic tunnel junction/ spin filter device; Proc. of SPIE vol. 7036 (2008).*

(Continued)

*Primary Examiner* — Whitney T Moore
(74) *Attorney, Agent, or Firm* — Holtz, Holtz, Goodman & Chick PC

(57) ABSTRACT

According to one embodiment, a magnetoresistive effect element includes a first ferromagnetic layer, a tunnel barrier formed on the first ferromagnetic layer, and a second ferromagnetic layer formed on the tunnel barrier layer. The tunnel barrier includes a nonmagnetic oxide having a spinel structure. Oxides forming the spinel structure are combined such that a single phase is formed by a solid phase in a component ratio region including a component ratio corresponding to the spinel structure and having a width of not less than 2%.

6 Claims, 12 Drawing Sheets

(56) References Cited

U.S. PATENT DOCUMENTS

| | | | |
|---|---|---|---|
| 2012/0061781 A1 | 3/2012 | Ohmori et al. | |
| 2012/0091548 A1 | 4/2012 | Sukegawa et al. | |
| 2012/0241881 A1 | 9/2012 | Daibou et al. | |

FOREIGN PATENT DOCUMENTS

| | | | |
|---|---|---|---|
| JP | 2010-109208 A | 5/2010 | |
| JP | 4834834 B2 | 12/2011 | |
| JP | 2012-124185 A | 6/2012 | |

OTHER PUBLICATIONS

Anna E. McHale et al.; "Phase Equilibria Diagrams; Phase Diagrams for Ceramists"; The American Ceramic Society; 1993; Annual 93; pp. 9-10, 14-18, 20, 75-77, 95-96 and 168-170; Westerville, Ohio, U.S.A.

Hiroaki Sukegawa et al.; "Applied Physics Letter: Tunnel magnetoresistance with improved bias voltage dependence in lattice-matched Fe/spinel $MgAl_2O_4$/Fe(001) junctions"; vol. 96; American Institute of Physics; 2010; pp. 212505-1-212505-3.

Ernest M. Levin et al.; "Phase Diagrams for Ceramists"; The American Ceramic Society; vol. 3; 1975; pp. 19-20, 50-52, 100-101, 111-112, 114-119, 158, 167, 170, 225-226, 237-243 and 425; Columbus, Ohio, U.S.A.

Robert S. Roth et al.; "Phase Diagrams for Ceramists"; The American Ceramic Society; vol. 6; 1987; pp. 3-4, 116, 119-127, 129, 138-139, 160, 187, 191-193, 264, 296-297, 338-341, 358-363 and 393; Westerville, Ohio, U.S.A.

Bjorn O. Mysen et al.; "Phase Diagrams for Ceramists"; The American Ceramic Society; vol. 8; 1990; pp. 24-25; Westerville, Ohio, U.S.A.

Allen M. Alper et al.; "Phase Diagrams; Materials Science and Technology"; vol. 4; 1976; pp. 182-183 and190-191; Academic Press.

Robert S. Roth et al.; "Phase Diagrams for Ceramists"; The American Ceramic Society; vol. 4; 1981; pp. 30, 92-93, 99-104, 114-116, 200-204 and 213-217; Columbus, Ohio, U.S.A.

Robert S. Roth et al.; "Phase Equilibria Diagrams"; The American Ceramic Society; vol. 14: Oxides; 2005; pp. 170-171, 178-182, 199-203, 265-267, 390-394, 419, 438-442, 452-454, 458-463, 467-468, 590, 593 and 625-632.

Ernest M. Levin et al.;"Phase Diagrams for Ceramists"; The American Ceramic Society; vol. 1; 1964; pp. 51-52, 54-56, 62, 65-67, 69, 98-99, 102, 110-114, 119-120, 123, 126, 142-143, 214, 242-251 and 527; Colombus, Ohio, U.S.A.

Ernest M. Levin et al.; "Phase Diagrams for Ceramists"; The American Ceramic Society; vol. 2 ; 1969; pp. 11-13, 35-37, 40-41, 46-48, 87-89, 92-94, 145, 152, 208 and 532; Columbus, Ohio, U.S.A.

Robert S. Roth et al.; "Phase Equilibria Diagrams; Phase Diagrams for Ceramists"; The American Ceramic Society; vol. 11: Oxides; 1995; pp. 70, 76-77, 86-88, 90-91, 100-101, 154, 177-178, 263, 327, 332-335, 390 and 447-448; Westerville, Ohio, U.S.A.

Anna E. Mchale et al.; "Phase Equilibria Diagrams"; The American Ceramic Society; vol. 12: Oxides; 1996; pp. 83-84, 96, 118-120, 225, 232-234, 236 and 357-358; Westerville, Ohio, U.S.A.

Anna E. Mchale et al.; "Phase Equilibria Diagrams; Phase Diagrams for Ceramists"; The American Ceramic Society; Annual 92; 1992; p. 3; Westerville, Ohio, U.S.A.

Related U.S. Appl. No. 13/962,918; First Named Inventor: Makoto Nagamine; Title: "Magnetoresistive Effect Element and Manufacturing Method Thereof", filed Aug. 8, 2013.

* cited by examiner

| No | Barrier material | Oxide 1 (XO) | Oxide 2 (YO) | Single phase by solid phase | Phase diagram literature | Melting point(°C) | Misfit(%) |
|---|---|---|---|---|---|---|---|
| 0 | MgO | — | — | — | — | 2825 | -3.8 |
| 1 | $CuAl_2O_4$ | CuO | $Al_2O_3$ | × | 2-2085 | Unknown | 0.3 |
| 2 | $CuGa_2O_4$ | CuO | $Ga_2O_3$ | Unknown | None | Unknown | -3.4 |
| 3 | $CuMn_2O_4$ | CuO | $Mn_2O_3$ | ○ Cu~0.33 | 12-9904 | Unknown | -2.7 |
| 4 | $MgAl_2O_4$ | MgO | $Al_2O_3$ | × | 1-259 | 2105 | 0.3 |
| 5 | $MgCr_2O_4$ | MgO | $Cr_2O_3$ | × | 1-262 | 2390 | -2.7 |
| 6 | $MgGa_2O_4$ | MgO | $Ga_2O_3$ | × | *1 | Unknown | -2.2 |
| 7 | $MgIn_2O_4$ | MgO | $In_2O_3$ | Unknown | None | Unknown | -8.0 |
| 8 | $MgTi_2O_4$ | MgO | $Ti_2O_3$ | ○ | 14-11392 | Unknown | -4.3 |
| 9 | $MgV_2O_4$ | MgO | $V_2O_3$ | × | 3-4335 | Unknown | -3.6 |
| 10 | $Mg_2SnO_4$ | MgO | $SnO_2$ | × | 6-6405 | Unknown | -5.7 |
| 11 | $Mg_2TiO_4$ | MgO | $TiO_2$ | ○ | 92-003 | Unknown | -4.0 |
| 12 | $Mg_2VO_4$ | MgO | $VO_2(V_2O_4)$ | Unknown | None | Unknown | -3.4 |
| 13 | $MnAl_2O_4$ | MnO | $Al_2O_3$ | ○ MnO~0.5 | 92-004 | Unknown | -1.8 |
| 14 | $MnTi_2O_4$ | MnO | $Ti_2O_3$ | Unknown | None | Unknown | -5.7 |
| 15 | $MnV_2O_4$ | MnO | $V_2O_3$ | Unknown | None | Unknown | -6.5 |
| 16 | $Mn_2SnO_4$ | MnO | $SnO_2$ | Unknown | None | Unknown | -8.5 |
| 17 | $Mn_2TiO_4$ | MnO | $TiO_2$ | Unknown | 1-277 | Unknown | -6.5 |
| 18 | $Mn_2VO_4$ | MnO | $VO_2(V_2O_4)$ | Unknown | None | Unknown | -5.5 |
| 19 | $SnAl_2O_4$ | SnO | $Al_2O_3$ | Unknown | 1-299 | 1950 | -0.2 |
| 20 | $ZnAl_2O_4$ | ZnO | $Al_2O_3$ | Unknown | None | Unknown | 0.3 |
| 21 | $ZnGa_2O_4$ | ZnO | $Ga_2O_3$ | Unknown | None | Unknown | -3.1 |
| 22 | $ZnV_2O_4$ | ZnO | $V_2O_3$ | Unknown | 6-6815 | Unknown | -3.6 |
| 23 | $Zn_2SnO_4$ | ZnO | $SnO_2$ | Unknown | None | Unknown | -6.4 |
| 24 | $Zn_2TiO_4$ | ZnO | $TiO_2$ | × | 1-303 | Unknown | -4.0 |
| 25 | $Zn_2VO_4$ | ZnO | $VO_2(V_2O_4)$ | Unknown | 6-6815 | Unknown | -3.3 |

FIG. 3

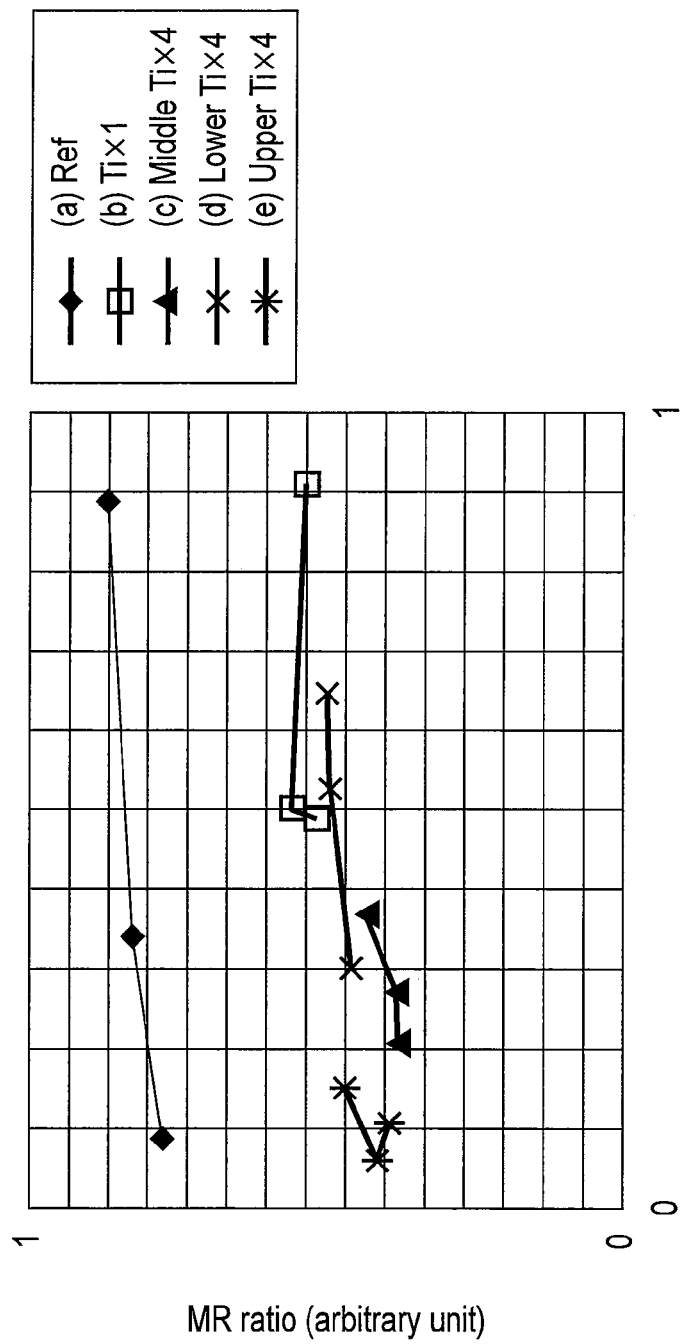
F I G. 5

| No | Metal | Standard electrode potential (V) | | No | Metal | Standard electrode potential (V) | | No | Metal | Standard electrode potential (V) | |
|----|-------|------|------|----|----|------|------|----|----|------|------|
| 1 | Sr | -4.1, -2.89 | $Sr^+ + e = Sr$, $Sr^{2+} + 2e = Sr$ | 16 | Dy | -2.295, -2.2 | $Dy^{3+} + 3e = Dy$, $Dy^{2+} + 2e = Dy$ | 46 | Ge | 0.124, 0.24 | $Ge^{2+} + 2e = Ge$, $Ge^{4+} + 4e = Ge$ |
| 2 | Ca | -3.80, -2.868 | $Ca^+ + e = Ca$, $Ca^{2+} + 2e = Ca$ | 17 | Lu | -2.28 | $Lu^{3+} + 3e = Lu$ | 47 | Re | 0.300 | $Re^{3+} + 3e = Re$ |
| 3 | Ba | -2.912 | $Ba^{2+} + 2e = Ba$ | 18 | Tb | -2.28 | $Tb^{3+} + 3e = Tb$ | 48 | Bi | 0.308, 0.5 | $Bi^{3+} + 3e = Bi$, $Bi^+ + e = Bi$ |
| 4 | Eu | -2.812, -1.991 | $Eu^{2+} + 2e = Eu$, $Eu^{3+} + 3e = Eu$ | 19 | Gd | -2.279 | $Gd^{3+} + 3e = Gd$ | 49 | Cu | 0.3419, 0.521 | $Cu^{2+} + 2e = Cu$, $Cu^+ + e = Cu$ |
| 5 | Yb | -2.76, -2.19 | $Yb^{2+} + 2e = Yb$, $Yb^{3+} + 3e = Yb$ | 20 | Nd | -2.1 | $Nd^{2+} + 2e = Nd$ | 50 | Ru | 0.455 | $Ru^{2+} + 2e = Ru$ |
| 6 | Mg | -2.70, -2.372 | $Mg^+ + e = Mg$, $Mg^{2+} + 2e = Mg$ | 21 | Sc | -2.077 | $Sc^{3+} + 3e = Sc$ | 51 | Rh | 0.600, 0.758 | $Rh(2,1)^+ + (2,1)e = Rh$, $Rh^{3+} + 3e = Rh$ |
| 7 | Sm | -2.68, -2.304 | $Sm^{2+} + 2e = Sm$, $Sm^{3+} + 3e = Sm$ | 22 | Th | -1.899 | $Th^{4+} + 4e = Th$ | 52 | Ag | 0.7996 | $Ag^+ + e = Ag$ |
| 8 | Tm | -2.4, -2.319 | $Tm^{2+} + 2e = Tm$, $Tm^{3+} + 3e = Tm$ | 23 | Be | -1.847 | $Be^{2+} + 2e = Be$ | 53 | Pd | 0.951 | $Pd^{2+} + 2e = Pd$ |
| 9 | La | -2.379 | $La^{3+} + 3e = La$ | 24 | V | -1.07 | | 54 | Ir | 1.156 | $Ir^{3+} + 3e = Ir$ |
| 10 | Y | -2.372 | $Y^{3+} + 3e = Y$ | 25 | Ti | -1.63, -1.37 | $Ti^{2+} + 2e = Ti$, $Ti^{3+} + 3e = Ti$ | 55 | Pt | 1.18 | $Pt^{2+} + 2e = Pt$ |
| 11 | Pr | -2.353, -2.0 | $Pr^{3+} + 3e = Pr$, $Pr^{2+} + 2e = Pr$ | 26 | Hf | -1.55 | $Hf^{4+} + 4e = Hf$ | 56 | Au | 1.498, 1.692 | $Au^{3+} + 3e = Au$, $Au^+ + e = Au$ |
| 12 | Ce | -2.336 | $Ce^{3+} + 3e = Ce$ | 27 | Pa | -1.49, -1.34 | $Pa^{4+} + 4e = Pa$, $Pa^{3+} + 3e = Pa$ | | | | |
| 13 | Er | -2.331, -2.0 | $Er^{3+} + 3e = Er$, $Er^{2+} + 2e = Er$ | 28 | Zr | -1.45 | $Zr^{4+} + 4e = Zr$ | | | | |
| 14 | Ho | -2.33, -2.1 | $Ho^{3+} + 3e = Ho$, $Ho^{2+} + 2e = Ho$ | 29 | Mn | -1.185 | $Mn^{2+} + 2e = Mn$ | | | | |
| 15 | Nd | -2.323 | $Nd^{3+} + 3e = Nd$ | 30 | V | -1.175 | $V^{2+} + 2e = V$ | | | | |
| | | | | 31 | Nb | -1.099 | $Nb^{3+} + 3e = Nb$ | | | | |
| | | | | 32 | Cr | -0.913, -0.744 | $Cr^{2+} + 2e = Cr$, $Cr^{3+} + 3e = Cr$ | | | | |
| | | | | 33 | Zn | -0.7618 | $Zn^{2+} + 2e = Zn$ | | | | |
| | | | | 34 | Ta | -0.6 | $Ta^{3+} + 3e = Ta$ | | | | |
| | | | | 35 | Ga | -0.549, -0.2 | $Ga^{3+} + 3e = Ga$, $Ga^+ + e = Ga$ | | | | |
| | | | | 36 | Fe | -0.447, -0.037 | $Fe^{2+} + 2e = Fe$, $Fe^{3+} + 3e = Fe$ | | | | |
| | | | | 37 | Cd | -0.403 | $Cd^{2+} + 2e = Cd$ | | | | |
| | | | | 38 | In | -0.3382, -0.14 | $In^{3+} + 3e = In$, $In^+ + e = In$ | | | | |
| | | | | 39 | Tl | -0.336, 0.741 | $Tl^+ + e = Tl$, $Tl^{3+} + 3e = Tl$ | | | | |
| | | | | 40 | Co | -0.28 | $Co^{2+} + 2e = Co$ | | | | |
| | | | | 41 | Ni | -0.257 | $Ni^{2+} + 2e = Ni$ | | | | |
| | | | | 42 | Mo | -0.200 | $Mo^{3+} + 3e = Mo$ | | | | |
| | | | | 43 | Sn | -0.1375 | $Sn^{2+} + 2e = Sn$ | | | | |
| | | | | 44 | Pb | -0.1262 | $Pb^{2+} + 2e = Pb$ | | | | |
| | | | | 45 | W | 0.1 | $W^{3+} + 3e = W$ | | | | |

F I G. 9

| No | Barrier material | Oxide 1 (XO) | Oxide 2 (YO) | Single phase by solid phase | Phase diagram literature | Standard electrode potential(V) | |
|---|---|---|---|---|---|---|---|
| | | | | | | X | Y |
| 0 | MgO | — | — | — | — | — | — |
| 1 | CuAl$_2$O$_4$ | CuO | Al$_2$O$_3$ | × | 2-2085 | 0.3419 | -1.662 |
| 2 | CuGa$_2$O$_4$ | CuO | Ga$_2$O$_3$ | Unknown | None | 0.3419 | -0.549 |
| 3 | CuMn$_2$O$_4$ | CuO | Mn$_2$O$_3$ | O Cu~0.33 | 12-9904 | 0.3419 | -1.185 |
| 4 | MgAl$_2$O$_4$ | MgO | Al$_2$O$_3$ | × | 1-259 | -2.7 | -1.662 |
| 5 | MgCr$_2$O$_4$ | MgO | Cr$_2$O$_3$ | × | 1-262 | -2.7 | -0.913 |
| 6 | MgGa$_2$O$_4$ | MgO | Ga$_2$O$_3$ | × | *1 | -2.7 | -0.549 |
| 7 | MgIn$_2$O$_4$ | MgO | In$_2$O$_3$ | Unknown | None | -2.7 | -0.3382 |
| 8 | MgTi$_2$O$_4$ | MgO | Ti$_2$O$_3$ | O | 14-11392 | -2.7 | -1.63 |
| 9 | MgV$_2$O$_4$ | MgO | V$_2$O$_3$ | × | 3-4335 | -2.7 | -1.175 |
| 10 | Mg$_2$SnO$_4$ | MgO | SnO$_2$ | × | 6-6405 | -2.7 | -0.1375 |
| 11 | Mg$_2$TiO$_4$ | MgO | TiO$_2$ | O | 92-003 | -2.7 | -1.63 |
| 12 | Mg$_2$VO$_4$ | MgO | VO$_2$(V$_2$O$_4$) | Unknown | None | -2.7 | -1.175 |
| 13 | MnAl$_2$O$_4$ | MnO | Al$_2$O$_3$ | O MnO~0.5 | 92-004 | -1.185 | -1.662 |
| 14 | MnTi$_2$O$_4$ | MnO | Ti$_2$O$_3$ | Unknown | None | -1.185 | -1.63 |
| 15 | MnV$_2$O$_4$ | MnO | V$_2$O$_3$ | Unknown | None | -1.185 | -1.175 |
| 16 | Mn$_2$SnO$_4$ | MnO | SnO$_2$ | Unknown | None | -1.185 | -0.1375 |
| 17 | Mn$_2$TiO$_4$ | MnO | TiO$_2$ | Unknown | 1-277 | -1.185 | -1.63 |
| 18 | Mn$_2$VO$_4$ | MnO | VO$_2$(V$_2$O$_4$) | Unknown | None | -1.185 | -1.175 |
| 19 | SnAl$_2$O$_4$ | SnO | Al$_2$O$_3$ | Unknown | None | -0.1375 | -1.662 |
| 20 | ZnAl$_2$O$_4$ | ZnO | Al$_2$O$_3$ | Unknown | 1-299 | -1.45 | -1.662 |
| 21 | ZnGa$_2$O$_4$ | ZnO | Ga$_2$O$_3$ | Unknown | None | -1.45 | -0.549 |
| 22 | ZnV$_2$O$_4$ | ZnO | V$_2$O$_3$ | Unknown | 6-6815 | -1.45 | -1.175 |
| 23 | Zn$_2$SnO$_4$ | ZnO | SnO$_2$ | Unknown | None | -1.45 | -0.1375 |
| 24 | Zn$_2$TiO$_4$ | ZnO | TiO$_2$ | × | 1-303 | -1.45 | -1.63 |
| 25 | Zn$_2$VO$_4$ | ZnO | VO$_2$(V$_2$O$_4$) | Unknown | 6-6815 | -1.45 | -1.175 |

F I G. 10

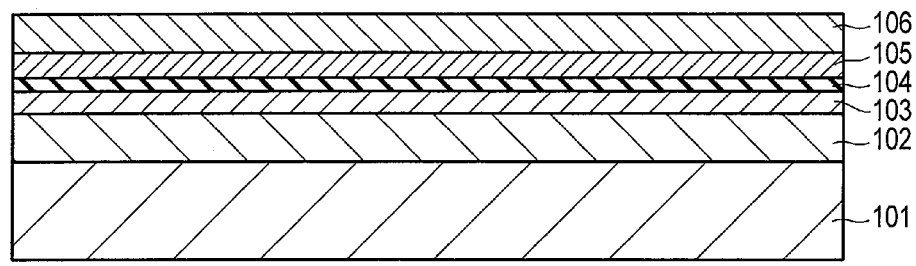
F I G. 1 2
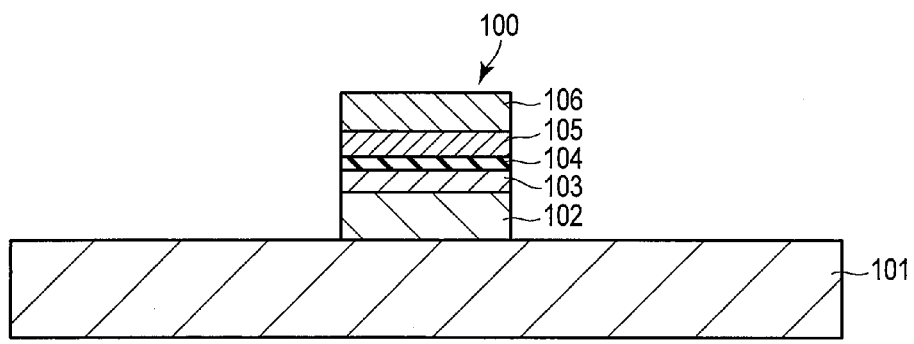
F I G. 1 3

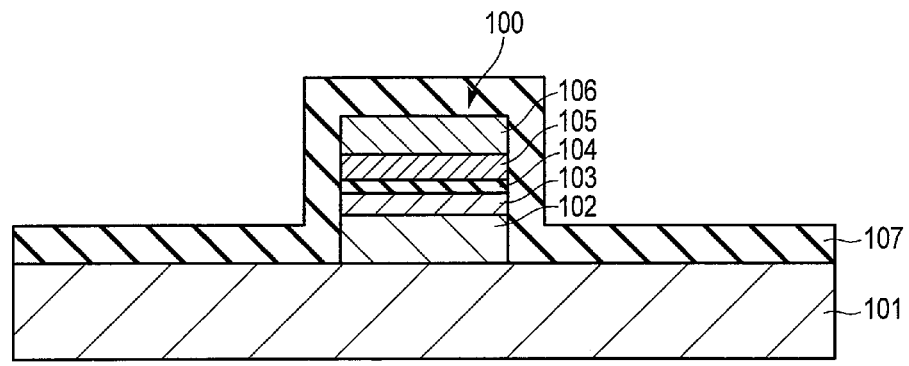
F I G. 14
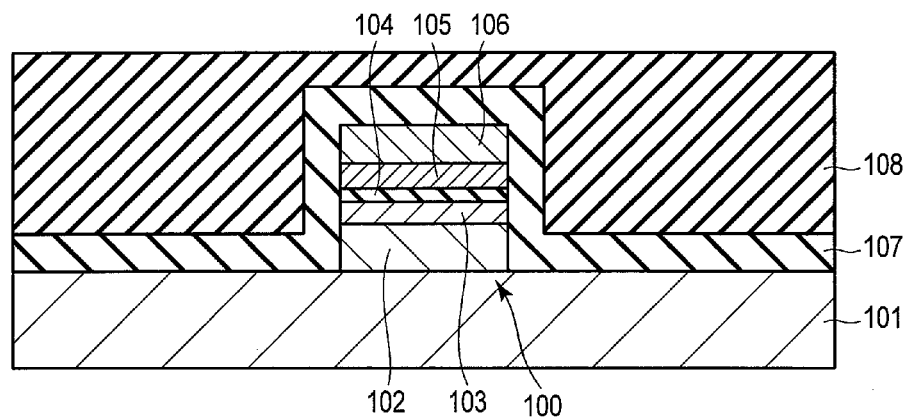
F I G. 15

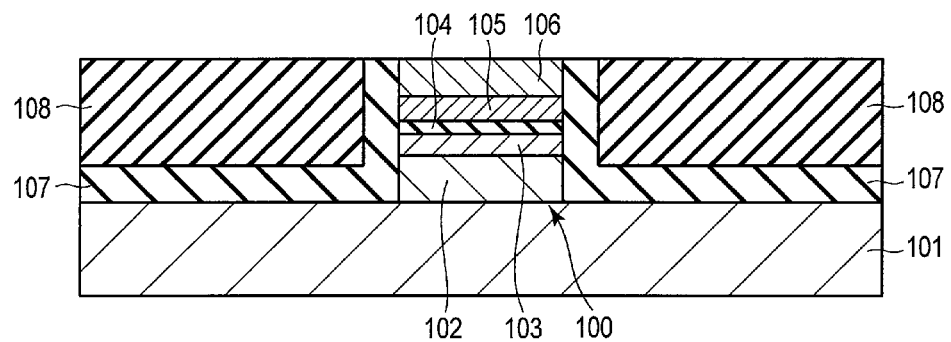
F I G. 16
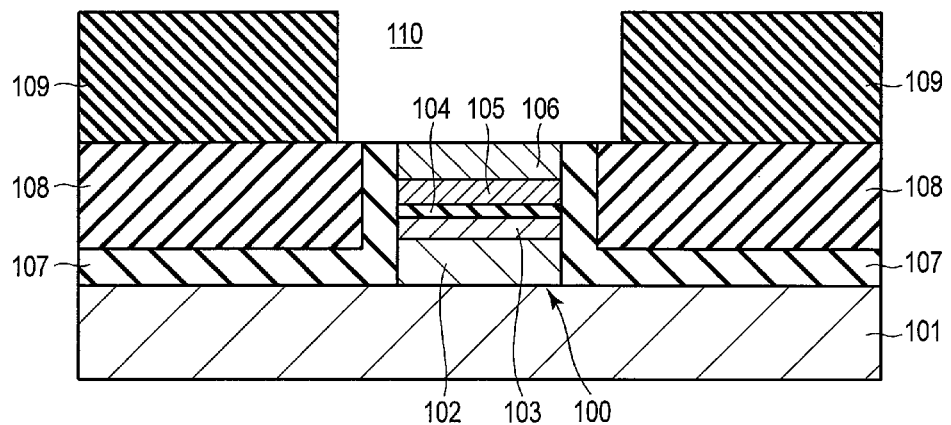
F I G. 17

MAGNETORESISTIVE EFFECT ELEMENT AND MANUFACTURING METHOD THEREOF

CROSS-REFERENCE TO RELATED APPLICATIONS

This application claims the benefit of U.S. Provisional Application No. 61/804,503, filed Mar. 22, 2013, the entire contents of which are incorporated herein by reference.

FIELD

Embodiments described herein relate generally to a magnetoresistive effect element and a manufacturing method thereof.

BACKGROUND

An MRAM (Magnetic Random Access Memory) is a memory device using a magnetic element having the magnetoresistive effect as a memory cell for storing information, and is attracting attention as a next-generation, high-speed, large-capacity nonvolatile memory device. The magnetoresistive effect is a phenomenon in which when a magnetic field is applied to a ferromagnetic material, the electrical resistance changes in accordance with the magnetization direction in the ferromagnetic material. The MRAM can be operated as a memory device by recording information by using the magnetization direction in the ferromagnetic material, and reading the information in accordance with the magnitude of the corresponding electrical resistance. Recently, it has become possible to obtain a very high magnetoresistance ratio (MR ratio) of 100% or more by the tunneling magnetoresistive (TMR) effect. As a consequence, a large-capacity MRAM including a magnetic tunnel junction (MTJ) element using the TMR effect is regarded as promising and attracting attention.

BRIEF DESCRIPTION OF THE DRAWINGS

FIG. 3 is a view showing whether a combination of oxides having a spinel structure forms a single phase by a solid phase;
FIG. 5 is a graph showing the relationship between the tunnel resistivity and MR ratio;
FIG. 9 is a view showing the standard electrode potentials of metals;
FIG. 10 is a view for explaining the standard electrode potentials of tunnel barriers having the spinel structure;
FIG. 12 is a view for explaining a manufacturing method of the MTJ element;
FIG. 13 is a view for explaining the manufacturing method of the MTJ element;
FIG. 14 is a view for explaining the manufacturing method of the MTJ element;
FIG. 15 is a view for explaining the manufacturing method of the MTJ element;
FIG. 16 is a view for explaining the manufacturing method of the MTJ element;
and
FIG. 17 is a view for explaining the manufacturing method of the MTJ element.

DETAILED DESCRIPTION

Figure 1:
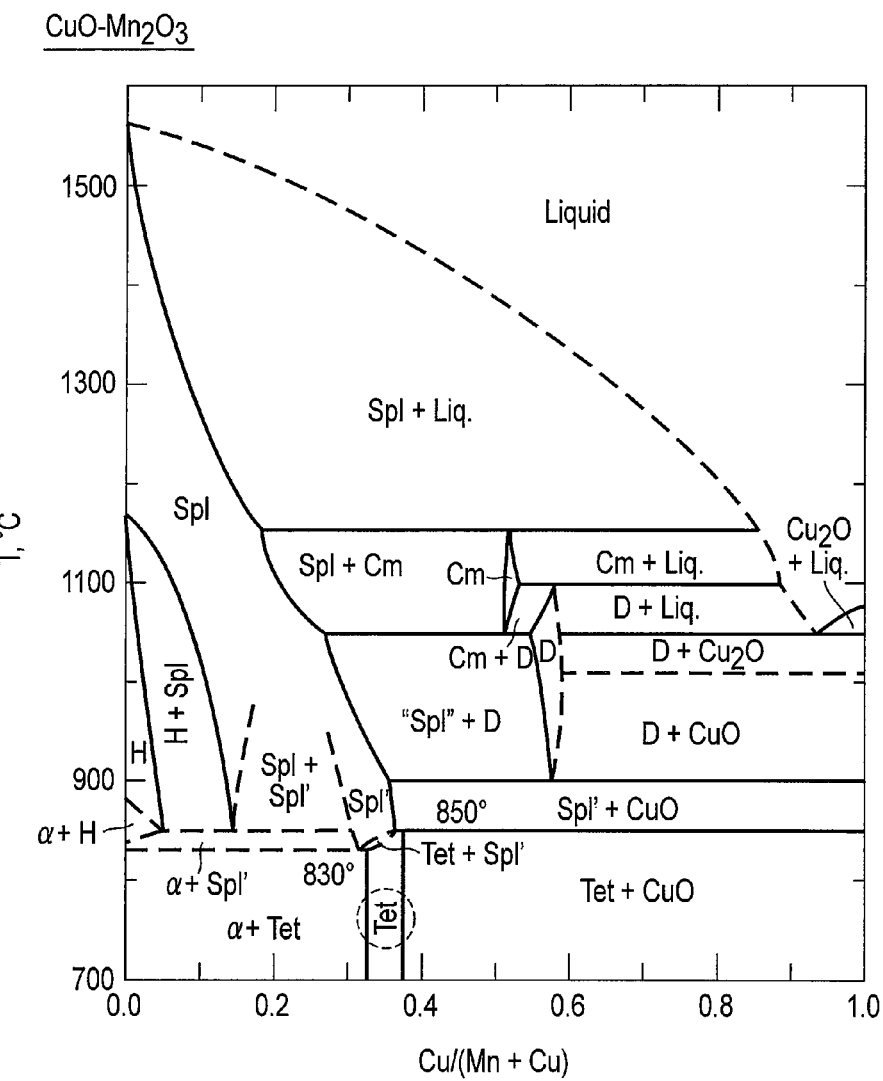
FIG. 1 is a phase diagram of $CuO$—$Mn_2O_3$.

In general, according to one embodiment, there is provided a magnetoresistive effect element comprising:
a first ferromagnetic layer;
a tunnel barrier formed on the first ferromagnetic layer; and
a second ferromagnetic layer formed on the tunnel barrier layer,
wherein the tunnel barrier includes a nonmagnetic oxide having a spinel structure, and
oxides forming the spinel structure are combined such that a single phase is formed by a solid phase in a component-ratio region including a component ratio corresponding to the spinel structure and having a width of not less than 2%.

The embodiment of the present invention will be explained below with reference to the accompanying drawings. Note that in the following explanation, the same reference numerals denote elements having the same functions and arrangements, and a repetitive explanation will be made only when necessary.

[1. Tunnel Barrier Materials Having Spinel Structure]

In a ferromagnetic tunnel junction (CoFeB/MgO/CoFeB) having a sandwich structure in which an MgO tunnel barrier is inserted between two CoFeB ferromagnetic layers, CoFeB is amorphous immediately after deposition. When annealing is performed, boron (B) diffuses, and an alloy containing cobalt (Co) and iron (Fe) is oriented together with MgO in the (001) plane, and the spin filter effect of a Δ1 band achieves a high MR ratio. In the (001)-oriented state, the lattice constant of MgO is 4.2117 Å, and that of Fe(001) is 4.0537 Å when multiplied by $\sqrt{2}$. Therefore, MgO is distorted in a state in which the lattice constant of MgO is larger by 3.8% than that of CoFeB. To increase the MR ratio by further promoting the (001) orientation, it is effective to use, as a tunnel barrier, a material having a spinel structure, e.g., a material having the same cubic system as that of MgO and a high degree of freedom in the crystal lattice because the crystal structure has a period longer than that of MgO, thereby relaxing the distortion between the tunnel barrier and CoFeB ferromagnetic layers.

Jpn. Pat. Appln. KOKAI Publication Nos. 2012-59957 and 2012-60087 have disclosed $MgAl_2O_4$ and $MgCr_2O_4$ as tunnel barriers having the spinel structure. As will be described later, however, each of these spinel-structure materials is a combination by which two types of oxides forming the spinel structure form no single phase by a solid phase. Accordingly, even when forming a tunnel barrier having the spinel structure from the two kinds of oxides forming the spinel structure, the spinel structure is difficult to form because there is a boundary between oxide phases that do not mix with each other. The boundary between oxide phases hinders the (001) orientation of the ferromagnetic layers and tunnel barrier, and makes the MR ratio difficult to increase. Also, the boundary between oxide phases is a leakage current path, and shortens the insulation breakdown life. Furthermore, $MgAl_2O_4$ and $MgCr_2O_4$ have high melting points (the melting point of $MgAl_2O_4$ is 2,105° C., and that of $MgCr_2O_4$ is 2,390° C.). Therefore, a high-temperature annealing step is necessary to form the spinel structure by mixing two types of oxides forming the spinel structure. This significantly deteriorates the magnetism of the magnetic layers adjacent to the tunnel barrier.

Hiroaki Sukegawa et al., "Applied Physics Letter", vol. 96, p. 212, 505 (2010) has disclosed an example in which $MgAl_2O_4$ is applied to the tunnel barrier of an MTJ element. In this literature, a sample on which $MgAl_2O_4$ is deposited is heated to 500° C. Since the melting point of $MgCr_2O_4$ is higher than that of $MgAl_2O_4$, a higher temperature is necessary in order to apply $MgCr_2O_4$ to the tunnel barrier. At a high temperature of 500° C. or more as described above, the magnetism of the magnetic layers adjacent to the tunnel barrier significantly deteriorates. This makes the material inappropriate as the tunnel barrier of an MTJ element.

This embodiment has been made in consideration of the above situation, and uses a low-melting-point, spinel-structure material, which is a combination by which two types of oxides forming the spinel structure form a single phase by a solid phase, as a tunnel barrier. This suppresses the formation of a boundary between oxide phases in the tunnel barrier, and suppresses the deterioration of magnetic layers by lowering the annealing temperature. In addition, the MR ratio is raised by promoting the (001) orientation of the ferromagnetic layers and tunnel barrier, and the insulation breakdown life is prolonged by suppressing a leakage current.

First, an example of a phase diagram of a combination by which two types of oxides forming the spinel structure form a single phase by a solid phase or a combination by which they form no single phase by a solid phase will be explained. The spinel structure is made of a nonmagnetic oxide XYO as a mixture of metal oxides XO and YO. Also, the spinel structure has two types, i.e., a cubic system and tetragonal system.

FIG. 1 is a phase diagram of a mixture $CuO-Mn_2O_3$ of Cu and $Mn_2O_3$. Note that the references for the phase diagrams shown in FIGS. 1 and 2 will be described later. Referring to FIG. 1, the abscissa indicates Cu/(Mn+Cu), and the ordinate indicates the temperature. In FIG. 1, $\alpha=\alpha-Mn_2O_3$, Cm=crednerite ($CuMnO_2$) structure solid solution, Spl=cubic spinel solid solution, Spl'=distorted spinal solid solution, Tet=tetragonal solid solution, H=hausmanite $Mn_3O_4$ solid solution, and D=delafossite ($CuMnO_2$) solid solution.

As shown in FIG. 1, $CuO-Mn_2O_3$ has a region (a region Tet indicated by the circle in FIG. 1) where a single phase is formed by a solid phase when Cu/(Mn+Cu)=about 0.33. This is so probably because the formation of the oxide-phase boundary between CuO and $Mn_2O_3$ is suppressed and the tunnel barrier is formed as a uniform layer in the spinel-structure material $CuMn_2O_4$. A single phase is a state in which two types of oxides are not phase-separated (i.e., there is no boundary between the two types of oxides).

As a composition ratio at which the two types of oxides forming the spinel structure show a single phase by a solid phase, one oxide need note cover an entire region of 0% to 100%. On the other hand, in order for the two types of oxides forming the spinel structure to show a single phase by a solid phase, the composition ratio at which they show a single phase by a solid phase must have a width to some extent. When mixing ratio variations in actual manufacturing steps are taken into consideration, a single phase need only be formed by a solid phase in a composition-ratio region having a width of, e.g., 2% or more, which includes the composition ratio corresponding to the spinel structure.

Figure 2:
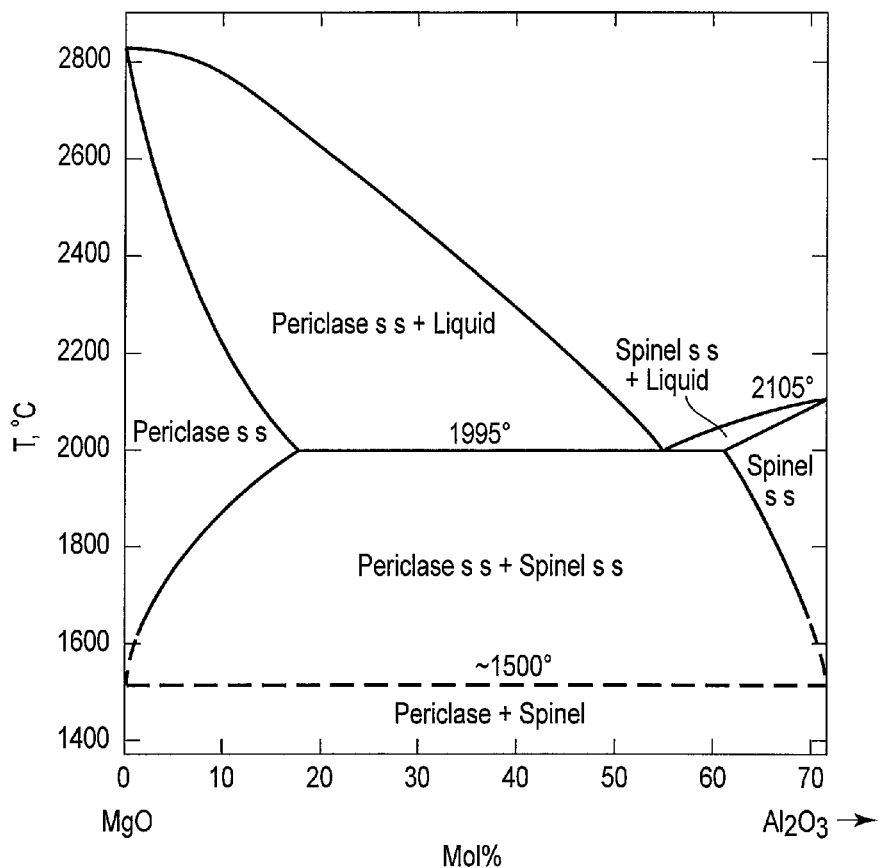
FIG. 2 is a phase diagram of $MgO$—$Al_2O_3$.

FIG. 2 is a phase diagram of a mixture $MgO-Al_2O_3$ of MgO and $Al_2O_3$. Referring to FIG. 2, the abscissa indicates mol % of $Al_2O_3/(MgO+Al_2O_3)$, and the ordinate indicates the temperature. A mixing ratio $Al_2O_3/(MgO+Al_2O_3)$ is equivalent to a mixing ratio Al/(Mg+Al).

In $MgO-Al_2O_3$, two types of phases are described at all mixing ratios of MgO and $Al_2O_3$, i.e., no single phase is formed by a solid phase at all the mixing ratios. When forming a spinel-structure material $MgAl_2O_4$ by using MgO and $Al_2O_3$, a phase boundary is formed between MgO and $Al_2O_3$, and this hinders the (001) orientation of the tunnel barrier and ferromagnetic layers.

FIG. 3 is a view showing whether a combination of oxides having the spinel structure forms a single phase by a solid phase. Materials shown in FIG. 3 are spinel-structure tunnel barrier materials, and obtained by mixing two types of oxides, i.e., oxide 1 (XO) and oxide 2 (YO). A phase diagram number in a reference literature is shown for each spinel-structure tunnel barrier material. Phase diagram references xx-yy refer to phase diagram numbers (xx denotes a volume number and yy denotes a diagram number) in the following references.

"Phase Diagrams for Ceramists", the American Ceramic Society, vols. 1 to 10, 92, and 93 (1967-1993).

*1: "PHASE DIAGRAMS", vol. 4, p. 182, Academic Press (1976)

The contents of No. 3 in FIG. 3 are obtained from the phase diagram shown in FIG. 1. The contents of No. 4 in FIG. 3 are obtained from the phase diagram shown in FIG. 2.

"Misfit" shown in FIG. 3 is a lattice misfit between a tunnel barrier and a ferromagnetic layer in contact with the tunnel barrier. This lattice misfit shown in FIG. 3 is a value with respect to the square root of a lattice constant "a" of Fe(001) by assuming CoFeB as the ferromagnetic layer in contact with the tunnel barrier. The square root ($\sqrt{2}a$) of the lattice constant "a" of Fe(001)=4.0537 Å. In the column "Single phase by solid phase", "○" represents that a single phase is formed by a solid phase, "x" represents that no single phase is formed by a solid phase, and "Unknown" represents that whether a single phase is formed by a solid phase is not described in a phase diagram.

When using a tunnel barrier having a small lattice misfit with respect to CoFeB, the lattice misfit between the tunnel barrier and CoFeB relaxes, and the (001) orientation is promoted, so the MR ratio increases. On the other hand, when using a tunnel barrier having a large (positive) lattice misfit with respect to CoFeB, the lattice of CoFeB is widened, and the magnetic anisotropy of the tunnel barrier/CoFeB interface increases. Accordingly, the effect of increasing the MR ratio by improving the magnetic characteristics of CoFeB can be expected.

As shown in FIG. 3, $CuMn_2O_4$, $MgTi_2O_4$, $Mg_2TiO_4$, and $MnAl_2O_4$ have composition ratios at which a single phase is formed by a solid phase. As described previously, $CuMn_2O_4$ has a region where a single phase is formed by a solid phase when Cu/(Mn+Cu)=about 0.33. $MnAl_2O_4$ has a region where a single phase is formed by a solid phase when MnO is about 50 mol %. Not only a tunnel barrier material that forms a single phase by a solid phase but also a tunnel barrier material that may or may not form a single phase by a solid phase has the possibility that a single phase is formed by a solid phase. Therefore, even a tunnel barrier material that may or may not form a single phase by a solid phase is applicable to this embodiment.

Note that when using a spinel-structure material having a low melting point as the tunnel barrier, a low annealing temperature suppresses the deterioration of magnetic layers, and the effect of increasing the MR ratio by promoting the (001) orientation of the ferromagnetic layers and tunnel barrier is obtained. A tunnel barrier like this contains a nonmagnetic oxide having the spinel structure, and the melting point of the nonmagnetic oxide is desirably as low as possible, e.g., 2,100° C. or less. Examples of the tunnel barrier satisfying the above condition are $Mg_2TiO_4$, $MgTi_2O_4$, $MnAl_2O_4$, and $CuMn_2O_4$.

[2. Experimental Results]

Figure 4:
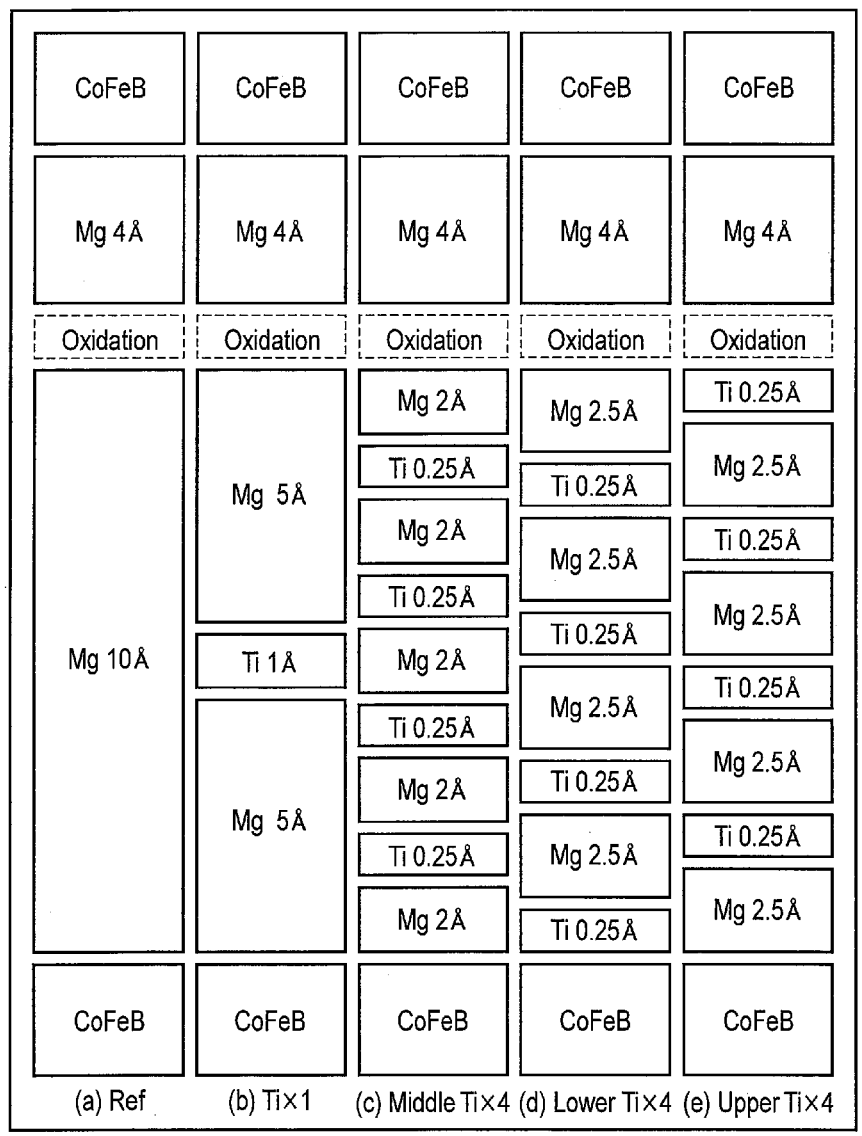
FIG. 4 is a schematic view for explaining manufacturing methods of MTJ elements used in experiments.

Next, the experimental results of magnetoresistive effect elements (MTJ (Magnetic Tunnel Junction) elements) having spinel-structure tunnel barriers will be explained. FIG. 4 is a schematic view for explaining manufacturing methods of the MTJ elements used in the experiments. FIG. 4 shows five types of manufacturing methods (a) to (e). FIG. 5 is a graph showing the relationship between a tunnel resistivity RA ($\Omega \cdot \mu m^2$) and MR (Magnetoresistance) ratio of each of the MTJ elements manufactured by the manufacturing methods shown in FIG. 4. Letting Rap be the resistance value of the MTJ element in a high-resistance state and Rp be that in a low-resistance state, the MR ratio is represented by "(Rap−Rp)/Rp". (a) to (e) in FIG. 5 respectively correspond to the experimental results of (a) to (e) in FIG. 4, and the numerical values on the ordinate and abscissa of FIG. 5 are represented by the relative ratio.

Referring to FIG. 4, a CoFeB layer is used as an example of each of the two ferromagnetic layers sandwiching the tunnel barrier. In FIG. 4, (a) is reference data, and the tunnel barrier is made of MgO. In (b) of FIG. 4, an Mg film (thickness=5 Å), Ti film (thickness=1 Å), and Mg film (thickness=5 Å) are deposited in this order on a CoFeB underlayer. In (c) of FIG. 4, Mg films (thickness=2 Å) and Ti films (thickness=0.25 Å) are alternately deposited, and an Mg film (thickness=2 Å) is deposited as the uppermost layer. In (d) of FIG. 4, Ti films (thickness=0.25 Å) and Mg films (thickness=2.5 Å) are alternately deposited. In (e) of FIG. 4, Mg films (thickness=2.5 Å) and Ti films (thickness=0.25 Å) are alternately deposited. After that, an oxidation step is performed, and an Mg film (thickness=4 Å) is deposited as a cap layer, in all of (a) to (e) in FIG. 4.

Also, in the manufacturing steps of (b) to (e) in FIG. 4, three kinds of oxidation steps were performed for the multilayered film of the Mg film and Ti film, thereby forming an MTJ element including an MgTiO film as a tunnel barrier. In the three kinds of oxidation steps, three patterns in which $O_2$ oxidation (a sample was exposed to an oxygen ambient) was performed for oxidation times of 120, 150, and 180 sec. were applied. Three points on each curve shown in FIG. 5 correspond to oxidation times of 120, 150, and 180 sec. Both the tunnel resistivity RA and MR ratio basically rose as the oxidation time increased. In (b) to (e) of FIG. 5, the total thicknesses of the Mg and Ti films were the same. In each of (b) to (e) in FIG. 5, the MR ratio was lower than that of Ref (with no Ti film) in (a) of FIG. 5, so an unoxidized Ti film presumably disturbed the (001) orientation of MgO and decreased the MR ratio.

Both the RA and MR ratio of (c) in FIG. 5 are lower than those of (b) in FIG. 5. This suggests that even when the Ti film was divided, the oxidation of the Ti films was not promoted, and unoxidized Ti films remained.

Both the RA and MR ratio of (d) in FIG. 5 are higher than those of (c) in FIG. 5. The Ti films were perhaps effectively oxidized because the Ti film as the lowermost layer in (d) of FIG. 5 was in contact with the CoFeB underlayer.

The RA of (e) in FIG. 5 is lower than that of (c) in FIG. 5, and the MR ratio of (e) in FIG. 5 is higher than that of (c) in FIG. 5. The Ti film as the uppermost layer of (e) in FIG. 5 was exposed to the oxygen ambient, and this probably promoted the oxidation of the Ti film and increased the MR ratio. The reason why the RA decreased was unknown. Assuming that the oxidation of the Ti film as the uppermost layer progressed first, however, the Ti oxide in the uppermost layer probably suppressed the downward diffusion of the oxidation species after that. This perhaps suppressed the oxidation of the Ti films and Mg films below the Ti film as the uppermost layer, and decreased the RA.

Figure 6:
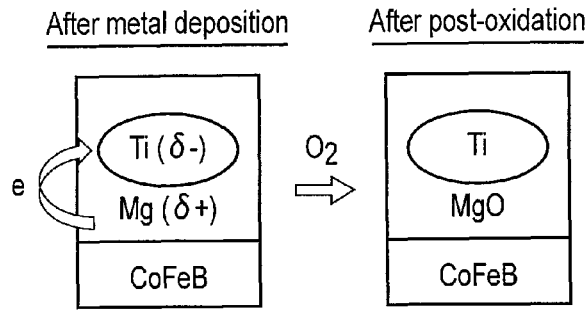
FIG. 6 is a schematic view for explaining the experimental result of (c) in FIG. 4.

FIG. 6 is a schematic view for explaining the experimental result of (c) in FIG. 4. In (c) of FIG. 4, the thickness of the Ti film was small, so Ti in the Mg film was not a film that expanded in the horizontal direction any more, but an island-like film as shown in FIG. 6. Electrons moved from readily oxidizable Mg to not easily oxidizable Ti, and Ti was negatively charged (δ−) and hardly reacted with a negatively charged oxidizing species such as $O_2^-$ (the oxidizing species was negatively charged probably because it received electrons on the surface of an object to be oxidized). Therefore, Ti remained unoxidized after post-oxidation.

Figure 7:
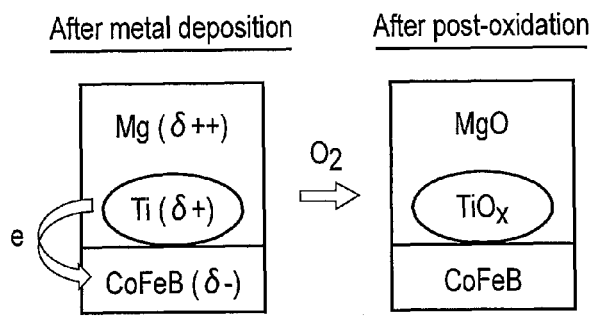
FIG. 7 is a schematic view for explaining the experimental result of (d) in FIG. 4.

FIG. 7 is a schematic view for explaining the experimental result of (d) in FIG. 4. Both the RA and MR ratio of (d) in FIG. 4 were higher than those of (c) in FIG. 4 perhaps because the Ti film as the lowermost layer in (d) of FIG. 4 was in contact with the CoFeB underlayer, so electrons moved from Ti to less easily oxidizable Co and Fe as shown in FIG. 7, and Ti was positively charged (δ+) and readily reacted with a negatively charged oxidizing species. This presumably promoted the oxidation of Ti.

Figure 8:
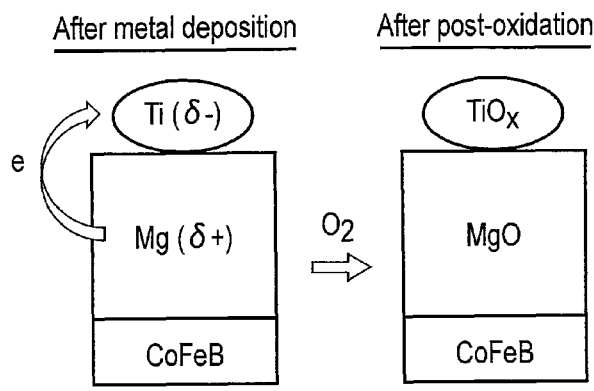
FIG. 8 is a schematic view for explaining the experimental result of (e) in FIG. 4.

FIG. 8 is a schematic view for explaining the experimental result of (e) in FIG. 4. The MR ratio of (e) in FIG. 4 was higher than that of (c) in FIG. 4 probably because electrons moved from readily oxidizable Mg to less easily oxidizable Ti to negatively charge Ti (δ−) and make Ti less easily oxidizable, but the oxidation of Ti was promoted because the periphery of Ti was exposed to the oxygen ambient.

FIG. 9 is a view showing standard electrode potentials as an index for selecting a manufacturing method by checking which of metal materials in contact with each other is more easily oxidizable. FIG. 9 is based on literature: "CRC handbook of Chemistry and Physics", 83rd Edition, CRC Press (2002). When each metal material has a plurality of standard electrode potentials, a smaller (more negative) value with which the material more easily oxidizes is used. The standard electrode potential is a result of checking the properties of each metal material as a solid from the potential difference between electrodes dipped in water at a temperature near room temperature. The present inventor believes that the standard electrode potential can be used as a relative index of the oxidizability of each metal material for an island-like mass of a few atoms or for one atom, because a solid is an aggregate of atoms, and even under oxidizing conditions at different temperatures and pressures.

When forming a spinel structure that forms a single phase by a solid phase by using two types of oxides XO and YO and using this spinel structure as a tunnel barrier, at least one of metals X and Y which has a higher standard electrode potential is negatively charged (δ−) by receiving electrons, and hence is not easily oxidizable by a negatively charged oxidizing species. In a manufacturing method in which the metals X and Y are deposited on a substrate (ferromagnetic layer) and post-oxidation is performed, a less easily oxidizable metal remains unoxidized as suggested by the experimental results shown in FIG. 5. As a manufacturing method of the MTJ element, therefore, a deposition method by which an oxide of at least one of the metals X and Y which has a higher standard electrode potential is deposited on a substrate. It is also possible to use a deposition method by which oxides of both of the metals X and Y are deposited on a substrate because oxygen atoms may move from an oxide of a not easily oxidizable metal to a readily oxidizable metal when the readily oxidizable metal and the oxide of the not easily oxidizable metal are deposited. Alternatively, it is possible to prepare a target or vapor deposition material made of the spinel-structure material XYO, and directly supply XYO onto a substrate.

In the experiments shown in FIG. 5, a result reflecting the difference between oxidizabilities was obtained for a minimum difference of 1.07 V (Mg and Ti) between the standard electrode potentials. Especially, when the standard electrode potential difference between the metals X and Y is 1.07 V or more, therefore, a deposition method of depositing an oxide on a substrate is preferably used for at least a less easily oxidizable one of the metals X and Y which has a higher standard electrode potential. This further improves the effect of preventing a not easily oxidizable metal from remaining unoxidized.

FIG. 10 is a view showing the standard electrode potentials of the metals X and Y of the tunnel barrier material XYO having the spinel structure shown in FIG. 3. In a manufacturing method by which the metals X and Y are deposited on a substrate and post-oxidation is performed, a least easily oxidizable metal may remain unoxidized. Accordingly, the MTJ element manufacturing method is preferably a deposition method by which an oxide of at least one of the metals X and Y which is less easily oxidizable and has a higher standard electrode potential (each hatched cell (each of a cell hatched with thin lines and a cell hatched with thick lines) shown in FIG. 10) is deposited on a substrate.

Also, a deposition method by which an oxide of at least one of the metals X and Y shown in FIG. 10 which is less easily oxidizable and has a higher standard electrode potential is deposited on a substrate is preferably used for a combination for which the standard electrode potential difference is 1.07 V or more (each cell hatched with thin lines in FIG. 10). This further improves the effect of preventing a not easily oxidizable metal from remaining unoxidized.

More specifically, when the standard electrode potentials of the metals X and Y are taken into consideration, the relationship between the spinel-structure tunnel barrier material XYO and the metal oxide deposited on a substrate (ferromagnetic layer) has variations (a) to (c) as follows.

(a) When the tunnel barrier is $Mg_2TiO_4$ or $MgTi_2O_4$, a titanium (Ti) oxide is deposited on the ferromagnetic layer.

(b) When the tunnel barrier is $MnAl_2O_4$, a manganese (Mn) oxide is deposited on the ferromagnetic layer.

(c) When the tunnel barrier is $CuMn_2O_4$, a copper (Cu) oxide is deposited on the ferromagnetic layer.

[3. Arrangement Of Magnetoresistive Effect Element]

The magnetoresistive effect element (MTJ element) and a manufacturing method thereof according to this embodiment will be explained in more detail below.

Figure 11:
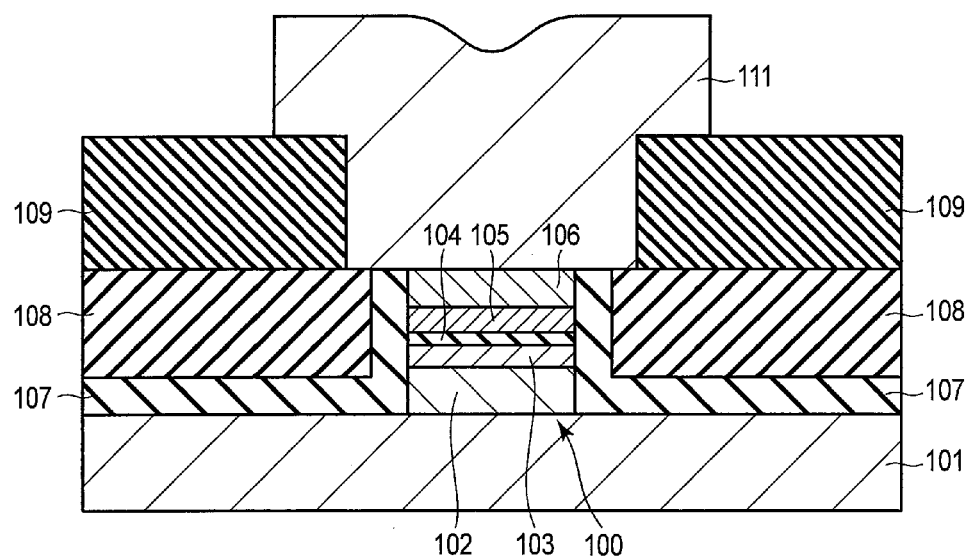
FIG. 11 is a sectional view of the MTJ element.

FIG. 11 is a sectional view of an MTJ element 100. The MTJ element 100 is formed on a lower interconnection layer 101. The MTJ element 100 is obtained by stacking an underlayer 102, a memory layer 103, a tunnel barrier 104 to which this embodiment is applied, a reference layer 105, and an upper layer 106 in this order. The memory layer 103 and reference layer 105 can also be stacked in the reverse order. The planar shape of the MTJ element 100 is not particularly restricted, and is, e.g., a circle or ellipse.

The memory layer 103 and reference layer 105 are ferromagnetic layers and have magnetic anisotropy perpendicular to the film surfaces, and the directions of easy magnetization in these layers are perpendicular to the film surfaces. That is, the MTJ element 100 is a perpendicular magnetization MTJ element in which the magnetization directions in the memory layer 103 and reference layer 105 are perpendicular to the film surfaces. Note that the MTJ element 100 may also be an in-plane magnetization MTJ element in which the magnetization directions in the memory layer 103 and reference layer 105 point in the in-plane direction.

In the memory layer 103, the magnetization direction is variable (reverses). In the reference layer 105, the magnetization direction is invariable (fixed). The reference layer 105 is so designed as to have much higher perpendicular magnetic anisotropic energy than that of the memory layer 103. The magnetic anisotropy can be set by adjusting the material constitution or thickness. Thus, a magnetization switching current of the memory layer 103 is reduced and made smaller than that of the reference layer 105. This makes it possible to implement the MTJ element 100 including the memory layer 103 having a variable magnetization direction and the reference layer 105 having an invariable magnetization direction with respect to a predetermined write current.

Each of the memory layer 103 and reference layer 105 is made of, e.g., CoFeB obtained by adding boron (B) to an alloy containing cobalt (Co) and iron (Fe).

The underlayer 102 is made of a nonmagnetic material, and formed to control the crystal orientation of the memory layer 103. The upper layer 106 is made of a metal or the like, and used as a mask when processing the MTJ element 100. The upper layer 106 may also be formed to function as an upper electrode.

This embodiment adopts a spin-transfer torque writing method by which a write current is directly supplied to the MTJ element 100 and the magnetization state of the MTJ element 100 is controlled by this write current. The MTJ element 100 can take one of a low-resistance state and high-resistance state in accordance with whether the relative relationship between the magnetization directions in the memory layer 103 and reference layer 105 is parallel or antiparallel.

When a write current flowing from the memory layer 103 to the reference layer 105 is supplied to the MTJ element 100, the relative relationship between the magnetization directions in the memory layer 103 and reference layer 105 becomes parallel. In this parallel state, the resistance value of the MTJ element 100 is lowest, and the MTJ element 100 is set in the low-resistance state. This low-resistance state of the MTJ element 100 is defined as, e.g., data "0".

On the other hand, when a write current flowing from the reference layer 105 to the memory layer 103 is supplied to the MTJ element 100, the relative relationship between the magnetization directions in the memory layer 103 and reference layer 105 becomes antiparallel. In this antiparallel state, the resistance value of the MTJ element 100 is highest, and the MTJ element 100 is set in the high-resistance state. This high-resistance state of the MTJ element 100 is defined as, e.g., data "1".

This makes the MTJ element 100 usable as a memory element capable of storing one-bit data (binary data). It is possible to freely set the resistance states and data allocation of the MTJ element 100.

When reading data from the MTJ element 100, a read voltage is applied to the MTJ element 100, and the resistance value of the MTJ element 100 is detected based on a read current flowing through the MTJ element 100. The read voltage is set at a value much smaller than a threshold at which magnetization reversal occurs due to spin-transfer torque.

(Manufacturing Method)

Next, the manufacturing method of the MTJ element will be explained. First, as shown in FIG. 12, an underlayer 102, a memory layer 103, a tunnel barrier 104 to which this embodiment is applied, a reference layer 105, and an upper layer 106 are deposited in this order on a lower interconnection layer 101.

As the tunnel barrier 104, the spinel-structure material made of a combination of oxides that form a single phase by a solid phase shown in FIG. 3 or 10 is used. Examples of the method of forming the tunnel barrier 104 are as follows. Assume that these methods use the spinel-structure material XYO, two types of oxides XO and YO, and two types of metals X and Y.

(1) Direct sputtering of an oxide mixture (the spinel-structure material XYO) target by RF (Radio Frequency)

(2) Simultaneous sputtering of targets of a plurality of pure oxides (the oxides XO and YO)

(3) After simultaneous sputtering of targets of a plurality of metals (the metals X and Y), post-oxidation is performed using oxygen gas, oxygen plasma, oxygen radical, or ozone (4) After simultaneous sputtering of the metal X and oxide YO, post-oxidation is performed on an unoxidized metal X (5) One of MBE (Molecular Beam Epitaxy), ALD (Atomic Layer Deposition), and CVD (Chemical Vapor Deposition), or another method When the difference between the standard electrode potentials between the metals X and Y is large and the metal Y is not easily oxidizable, it is desirable to use method (1), (2), or (4) other than method (3). The manufacturing method of the tunnel barrier 104 is favorably a deposition method by which, of a plurality of oxides having the spinel structure, an oxide of at least one metal that has a high standard electrode potential and is not easily oxidizable is deposited on the memory layer 103. This achieves the effect of preventing a not easily oxidizable metal from remaining unoxidized.

Subsequently, as shown in FIG. 13, the underlayer 102, memory layer 103, tunnel barrier 104, reference layer 105, and upper layer 106 on the lower interconnection layer 101 are selectively etched by, e.g., ion milling.

As shown in FIG. 14, an insulating layer 107 for protecting the MTJ element 100 in the next step is formed by, e.g., sputtering, CVD, or ALD. The insulating layer 107 is made of, e.g., silicon nitride (SiN), silicon oxide ($SiO_x$), magnesium oxide (MgO), or aluminum oxide ($AlO_x$). Subsequently, the lower interconnection layer 101 is selectively etched by using, e.g., RIE (Reactive Ion Etching). The processed portions of the under interconnection layer 101 are, e.g., the front and back sides of the drawing surface of FIG. 14, and hence are not shown in FIG. 14. In this step, the MTJ element 100 is protected by the insulating layer 107.

As shown in FIG. 15, an insulating layer 108 is formed by, e.g., sputtering or CVD. The insulating layer 108 is made of, e.g., silicon oxide ($SiO_x$).

As shown in FIG. 16, the insulating layer 108 is etched back by, e.g., CMP (Chemical Mechanical Polishing) or vapor phase etching, thereby exposing the upper surface of the upper layer 106.

As shown in FIG. 17, an insulating layer 109 is formed, and a contact hole 110 is formed above the MTJ element 100 by RIE or the like. The insulating layer 109 is made of, e.g., silicon oxide ($SiO_x$).

Subsequently, as shown in FIG. 11, an upper interconnection layer 111 is formed on the MTJ element 100 and selectively etched by RIE or the like, thereby manufacturing a memory cell portion including the MTJ element.

[4. Effects]

In this embodiment as has been descried in detail above, a low-melting-point, spinel-structure material made of a combination by which two types of oxides forming the spinel structure form a single phase by a solid phase is used as the tunnel barrier of an MTJ element. This suppresses the formation of a boundary between oxide phases in the tunnel barrier, and suppresses the deterioration of magnetic layers by lowering the annealing temperature. In addition, the MR ratio is raised by promoting the (001) orientation of the ferromagnetic layers and tunnel barrier, and the insulation breakdown life is prolonged by suppressing a leakage current.

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
a first ferromagnetic layer;
a tunnel barrier formed on the first ferromagnetic layer; and
a second ferromagnetic layer formed on the tunnel barrier layer,
wherein the tunnel barrier includes a nonmagnetic oxide having a spinel structure,
wherein the tunnel barrier includes one material selected from the group consisting of $MgTi_2O_4$, $MnAl_2O_4$, and $CuMn_2O_4$, and
wherein the first ferromagnetic layer includes an alloy containing cobalt (Co) and iron (Fe).

2. The element of claim 1, wherein a melting point of the tunnel barrier is not more than 2,100° C.

3. The element of claim 1, wherein:
the nonmagnetic oxide is a single phase and a solid phase,
the nonmagnetic oxide is XYO including a metal oxide XO and a metal oxide YO, and
a component ratio X/(X+Y) is not less than 2 mol %.

4. A manufacturing method of a magnetoresistive effect element, the method comprising:
forming a tunnel barrier on a first ferromagnetic layer; and
forming a second ferromagnetic layer on the tunnel barrier,
wherein the tunnel barrier includes a nonmagnetic oxide XYO having a spinel structure,
wherein the forming the tunnel barrier includes depositing, on the first ferromagnetic layer, an oxide of one of a metal X and a metal Y, which has a higher standard electrode potential, and
wherein the tunnel barrier includes one material selected from the group consisting of $MgTi_2O_4$, $MnAl_2O_4$, and $CuMn_2O_4$.

5. The method of claim 4, wherein:
(a) when the tunnel barrier is $MgTi_2O_4$, a titanium (Ti) oxide is deposited on the first ferromagnetic layer,
(b) when the tunnel barrier is $MnAl_2O_4$, a manganese (Mn) oxide is deposited on the first ferromagnetic layer, and
(c) when the tunnel barrier is $CuMn_2O_4$, a copper (Cu) oxide is deposited on the first ferromagnetic layer.

6. The method of claim 4, wherein the first ferromagnetic layer includes an alloy containing cobalt (Co) and iron (Fe).

* * * * *